(12) United States Patent
Hamilton et al.

(10) Patent No.: US 7,065,107 B2
(45) Date of Patent: Jun. 20, 2006

(54) SPECTRAL BEAM COMBINATION OF BROAD-STRIPE LASER DIODES

(75) Inventors: Charles E. Hamilton, Kenmore, WA (US); Dennis D Lowenthal, Edmonds, WA (US); Roy D. Mead, Edmonds, WA (US)

(73) Assignee: Aculight Corporation, Bothell, WA (US)

( * ) Notice: Subject to any disclaimer, the term of this patent is extended or adjusted under 35 U.S.C. 154(b) by 362 days.

(21) Appl. No.: 10/687,495

(22) Filed: Oct. 16, 2003

(65) Prior Publication Data
US 2005/0018740 A1 Jan. 27, 2005

Related U.S. Application Data

(60) Provisional application No. 60/490,376, filed on Jul. 25, 2003.

(51) Int. Cl.
*H01S 3/098* (2006.01)
*H01S 3/08* (2006.01)

(52) U.S. Cl. ............................ 372/19; 372/98; 372/103
(58) Field of Classification Search ................. 372/19
See application file for complete search history.

(56) References Cited

U.S. PATENT DOCUMENTS 4,905,252 A * 2/1990 Goldberg et al. .............. 372/94

6,192,062 B1   2/2001  Sanchez-Rubio et al. ..... 372/92
6,665,320 B1 * 12/2003 Arbore et al. ................ 372/20
6,782,016 B1 *  8/2004 Braiman et al. .............. 372/26

OTHER PUBLICATIONS

Ming-Wei Pan, et al., "Fiber-coupled high-power external-cavity semiconductor lasers for real-time Raman sensing", Applied Otics, vol. 37, No. 24, Aug. 20, 1998.
Jean-Francois Lepage, et al., "Apodizing holographic gratings for the modal control of semiconductor lasers", Applied Optics, vol. 36, No. 21, Jul. 20, 1997.
Carlow R. Fernandez-Pousa, et al., "Talbot conditions, Talbot resonators, and first-order systems", J. Opt. Soc. AM, A, vol. 20, No. 4, Apr. 2003.
R.G. Waarts, et al. "Coherent Radiation from a broad area semiconductor laser in an external cavity", Laser-Diode Technology and Applications II, SPIE, vol. 1219, (1990).
Sylvan Mailhot, et al. "Single-mode operation of a broad-area semiconductor laser with an anamorphic external cavity: experimental and numerical results" Applied Optics, vol. 39, No. 36, Dec. 20, 2000.

(Continued)

*Primary Examiner*—Armando Rodriguez
(74) *Attorney, Agent, or Firm*—Patent Law Office of David G. Beck

(57) ABSTRACT

A method and apparatus for improving the beam quality of the emissions from a multimode gain medium such as a broad-stripe laser through the use of SBC techniques is provided. In order to achieve the desired beam quality without a significant reduction in output power, discrete lasing regions are formed across the gain medium using an etalon or similar device located within the SBC cavity.

50 Claims, 7 Drawing Sheets

OTHER PUBLICATIONS

Morris B. Snipes, Jr., et al. "Transverse mode filtering of wide stripe semiconductor lasers using an external cavity", SPIE vol. 1634, Laser Diode Technology and Applications IV (1992).

A.C. Fey-den Boer, et al.. "Grating feedback in a 810 nm broad-area diode laser", Applied Physics B. 63, 117-120 (1996).

Sylvie Yiou, et al. "Improvement of the spatial beam quality of laser sources with an intracavity Bragg grating", Optics Letters, vol. 28, No. 4, Feb. 15, 2003.

W. Nagengast, et al., "High-power single-mode emission from a broad-area semiconductor laser with a pseudoexternal cavity and a Fabry-Perot etalon", Optics Letters, vol. 22, No. 16, Aug. 15, 1997.

Damien Stryckman, et al., "Improvement of the lateral-mode discrimination of broad-area diode lasers with a profiled reflectivity output facet", Applied Optics, vol. 35, No. 30, Oct. 20, 1996.

Takashige Omatsu, et al. "Longitudinal-single mode operation of broad-stripe laser diode using a photorefractive phase conjugator", SPIE, vol. 2896 (1996).

* cited by examiner

SPECTRAL BEAM COMBINATION OF BROAD-STRIPE LASER DIODES

CROSS-REFERENCES TO RELATED APPLICATION

This application claims the benefit of provisional patent application Ser. No. 60/490,376 filed Jul. 25, 2003, the disclosure of which is incorporated herein by reference for all purposes.

GOVERNMENT RIGHTS NOTICE

This invention was made with Government support under Contract No. N00039-02-C-3227 awarded by the Navy Space and Naval Warfare Systems Command. The Government has certain rights in the invention.

FIELD OF THE INVENTION

The present invention relates generally to optical systems and, more particularly, to a method and apparatus for improving the beam quality of the emissions from a multimode gain medium such as a broad area laser.

BACKGROUND OF THE INVENTION

High power laser diodes are being increasingly considered for a variety of applications including material processing, optical memories, optical communication systems, medical systems and optical pumping of other lasers (e.g., solid-state lasers). As most of these applications require single mode operation to maximize energy transfer efficiencies, initially single element, narrow width laser diodes were considered given their ability to output stable, diffraction limited, single mode output beams. However, given the power limitations of such lasers, other laser sources have been under investigation.

Wide injection stripe lasers are available which can produce in excess of 50 watts in continuous mode or 100 watts in pulsed mode from a 1-centimeter wide device. Such lasers are designed with one or more emitting segments, each of which emits a multimode beam along the width of the laser diode's aperture. The width of the aperture is typically much greater than would result in single-transverse mode operation, thus resulting in such lasers commonly being referred to as broad-area or broad-stripe lasers. These lasers may have their emitters arranged in multiple, closely spaced segments, or may have a substantially continuous distribution of emitters across their width. The beam quality of such devices is usually very poor. Single-stripe devices typically have broad area emitters about 150 microns wide, with beam qualities tens of times the diffraction limit. Diode laser bars may have many of these stripes arranged along a 1-centimeter wide aperture, with beam quality about one-thousand times the diffraction limit.

Given the output power and efficiency benefits associated with broad-stripe lasers, there has been considerable research into exploring possible techniques of improving their beam quality. For example, a recent publication by C. R. Fernandez-Pousa et al. entitled "Talbot Conditions, Talbot Resonators, and First-Order Systems" in J. Opt. Soc. Am. A 20, 638–643 (April 2003) discussed the application of the Talbot effect to array radiators as a means of producing coherent emission.

Another approach that has been investigated to control the beam quality of a broad-stripe laser is the use of mode-selective cavities. For example, in an article entitled "Coherent Radiation from a Broad Area Semiconductor Laser in an External Cavity" by R. G. Waarts et al. in Proc. SPIE 1219 Laser Diode Technology and Applications II, 172–178 (1990), the authors describe the use of an external cavity consisting of a gain guided array, a graded index lens and a mode selective mirror. The authors reported achieving 410 milliwatts operating in a continuous mode with a diffraction limited far field pattern. M. B. Snipes, Jr., et al. reported achieving similar results (e.g., a nearly diffraction limited beam of greater than 250 milliwatts) using an unstable cavity in which a cylindrical lens caused the higher order modes to be more lossy than the fundamental ("Transverse Mode Filtering of Wide Stripe Semiconductor Lasers Using an External Cavity" Proc. SPIE 1634 Laser Diode Technology and Applications IV, 542–551, 2000).

Gratings have also been used to control the beam quality of broad-stripe lasers. For example, A. C. F. Boer et al. describe achieving narrow linewidth, single mode operation from a broad-area laser diode in an article entitled "Grating Feedback in a 810 nm Broad-Area Diode Laser" published in Appl. Phys. B 63, 117–120 (1996). As disclosed, the first order reflection of the grating is reflected back into the laser, resulting in a frequency selective external cavity.

Other approaches that have been used to improve the beam quality of broad-stripe lasers include profiling the reflectivity of the output facet of the laser diode using a thin layer of SiO; insertion of a Fabry-Perot etalon into the external cavity; insertion of a Bragg grating into the external cavity; and using a photorefractive phase conjugator as the external cavity mirror.

Although the various techniques disclosed above have demonstrated that it is possible to achieve narrow linewidth or single mode operation from a broad-stripe laser, they have yet to demonstrate the ability to be scaled to output powers in watts or tens of watts. Accordingly, what is needed in the art is a method of improving the beam quality of a broad-stripe laser while maintaining the output powers associated with such lasers. The present invention provides such a method and apparatus.

SUMMARY OF THE INVENTION

The present invention provides a method and apparatus for improving the beam quality of the emissions from a multimode gain medium such as a broad-stripe laser through the use of Spectral Beam Combination (SBC) techniques. In order to achieve the desired beam quality without a significant reduction in output power, discrete lasing regions referred to herein as pseudo emitters are formed across the gain medium. The required wavelength-periodic variations are formed using an etalon or similar device located within the SBC cavity.

According to one aspect of the invention, the lateral spacing between adjacent pseudo emitters is on the order of the width of the lowest-order transverse mode of the cavity. The lateral spacing is not allowed to be substantially greater than the width of the fundamental mode to insure that unextracted gain regions are not left between the pseudo emitters. The lateral spacing is not allowed to be substantially less than the width of the fundamental mode to insure that the output beam quality is not degraded.

According to another aspect of the invention, the width of the spatial filter within the SBC optical system is selected such that its image, projected back into the laser diode, is only large enough to admit emissions from a single pseudo emitter.

According to another aspect of the invention, the multi-mode gain medium is a broad-stripe laser diode that is modified to double as the etalon. Preferably the rear facet of the laser diode is coated with a high reflectance coating, the coating serving as one of the reflectors in the SBC system's external resonator cavity. The reflectivity of the front facet of the laser diode is selected to be within a range of reflectivities, thus insuring that power can be efficiently extracted from the pseudo emitters while suppressing lasing at the wavelengths of minimum gain.

A further understanding of the nature and advantages of the present invention may be realized by reference to the remaining portions of the specification and the drawings.

DESCRIPTION OF THE SPECIFIC EMBODIMENTS

Figure 1:
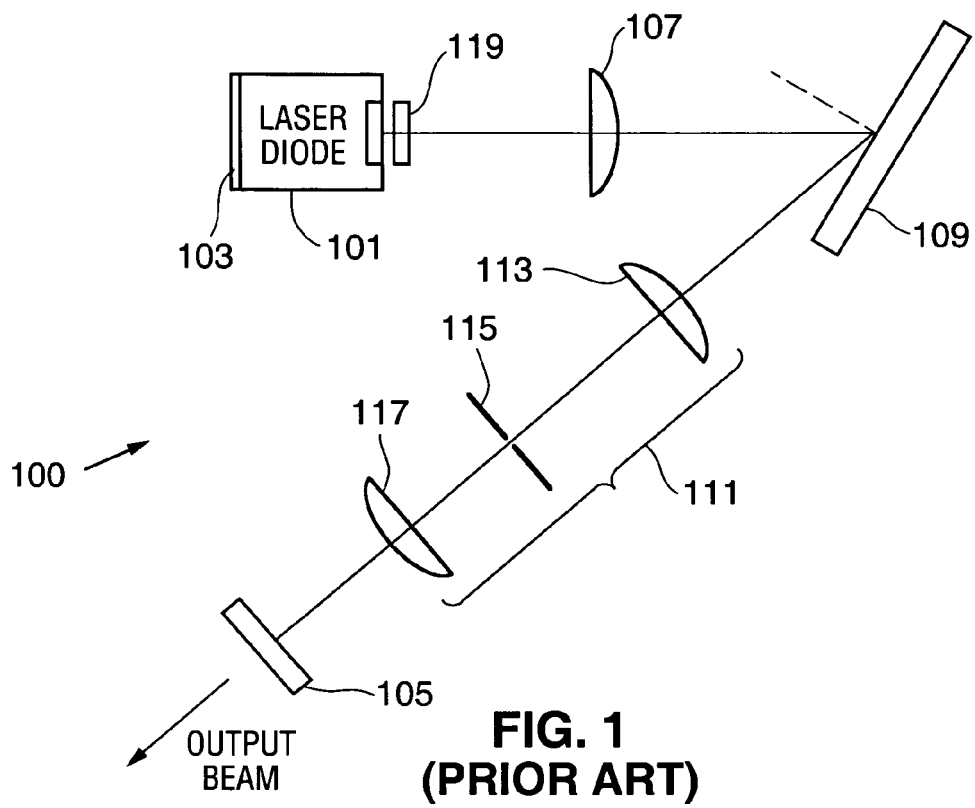
FIG. 1 is a schematic illustration of an SBC optical system according to the prior art.

Spectral beam combining (SBC) is a method developed to improve the beam quality from laser diode bars, arrays of fiber lasers, and other lasers with linearly arranged gain elements. An example of an SBC optical system 100 according to the prior art is shown in FIG. 1 in which the beam quality of a multi-gain element laser device 101 (e.g., a diode laser bar) is improved in the direction across the width of the bar (i.e., the slow direction). The output of multi-gain element laser device 101 is coupled to an external resonator cavity comprised of a high reflectance coating 103, preferably applied to the back facets of laser device 101, and an output coupler 105. Since the external resonator cavity controls the wavelength of oscillation, preferably the front facets of laser device 101 are coated with an anti-reflection (AR) coating. Interposed between laser device 101 and output coupler 105 are a collimating optic 107, a dispersive element 109 and a spatial filter 111. In the illustrated embodiment, spatial filter 111 is comprised of a first lens 113, an aperture 115 and a second lens 117. It will be understood by those of skill in the art that aperture 115 is typically a slit, although other aperture types can also be used such as circular or oblong apertures.

System 100 may also include an additional optical element 119 positioned adjacent to the emitting facets of laser device 101. Due to the rapidly diverging, astigmatic nature of the emissions from the gain elements within laser device 101, optical element 119 is useful for reducing the divergence, thus allowing a reduction in the size of the optics which follow optic 119, e.g., optic 107. In addition, system 100 is less aberration sensitive due to the inclusion of optical element 119.

Collimating optic 107 serves two purposes. First, optic 107 collimates the light from individual gain elements within laser device 101. Second, optic 107 causes the light from individual gain elements within laser device 101 to be spatially overlapped onto dispersive element 109, assuming that the distance separating dispersive element 109 from optic 107 is substantially equal to the focal length of optic 107. Typically the distance separating dispersive element 109 from optic 107 is substantially equivalent to the focal length of lens 107 as is the distance separating laser device 101 from optic 107.

Output coupler 105 feeds part of the radiation reflected from dispersive element 109 back into the apertures of the gain elements of laser device 101. Each distinct gain element will oscillate at a wavelength determined by its position across the field of the focusing element, as long as it is well separated from the influences of adjacent gain elements. Each distinct emitter lases at a wavelength such that the outputs from all the emitters along laser device 101 exit the cavity collimated and collinear. The resulting beam appears as though it originates from the aperture of a single emitter thereby yielding a beam quality equal to that of a single emitter, rather than that of the laser device comprised of many individual independent emitters. As a result of system 100, the spectral brightness is reduced (i.e., increased spectral bandwidth) and the spatial brightness is greatly increased (i.e., improved beam quality). Accordingly, SBC systems have provided a means of generating high quality focusable beams for applications that are not sensitive to the laser bandwidth.

The beam quality of the output beam from SBC system 100 is similar to that of an individual gain element of laser device 101. Accordingly, if single-transverse-mode elements are used, the output beam will be near diffraction limited and capable of being coupled into a single-mode fiber with high efficiency. For example, the assignee of the present invention has demonstrated this technique with as many as 400 emitters with a spacing of 50 microns in two 1-centimeter long diode bars. Prior to beam combining with an SBC system, the diode bar had a beam quality of 4,000 times the diffraction limit in the slow direction. Applying SBC techniques, the beam quality was 1.3 times the diffraction limit. The bandwidth for a laser operating at approximately 810 nanometers can be designed to be anything up to approximately 30 nanometers. It is important to note that the external SBC cavity does not result in a significant efficiency penalty. For example, in cavities of this type cavity efficiencies greater than 70 or 80 percent have been achieved.

Figure 2:
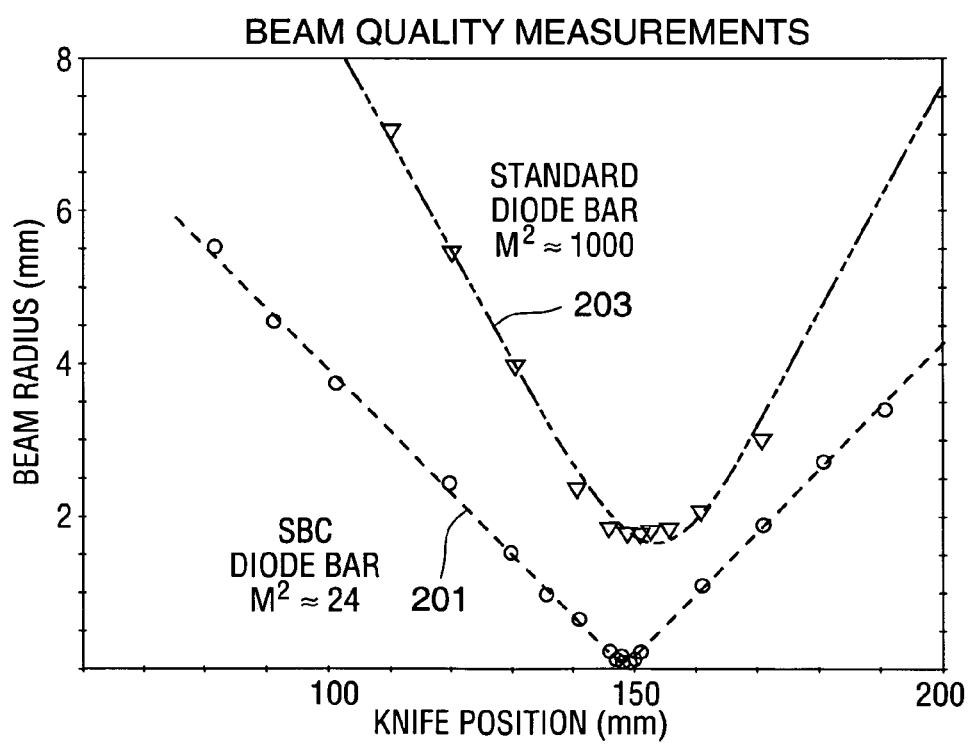
FIG. 2 graphically illustrates the improvement in beam quality achieved by application of an SBC cavity to a diode laser bar composed of multiple broad stripes.

As previously noted, an SBC cavity such as that shown in FIG. 1 can be used with a variety of gain media. FIG. 2 graphically illustrates the improvement in beam quality that application of an SBC cavity can achieve with a 1-centimeter diode laser bar made up of ten broad-stripe diode laser sources (e.g., curve 201). For comparison purposes, FIG. 2 also includes the focused beam radius for a conventional diode bar (e.g., curve 203). The SBC cavity improved the beam quality of the broad-stripe diode laser source to be equal to that of a single emitter.

Figure 3:
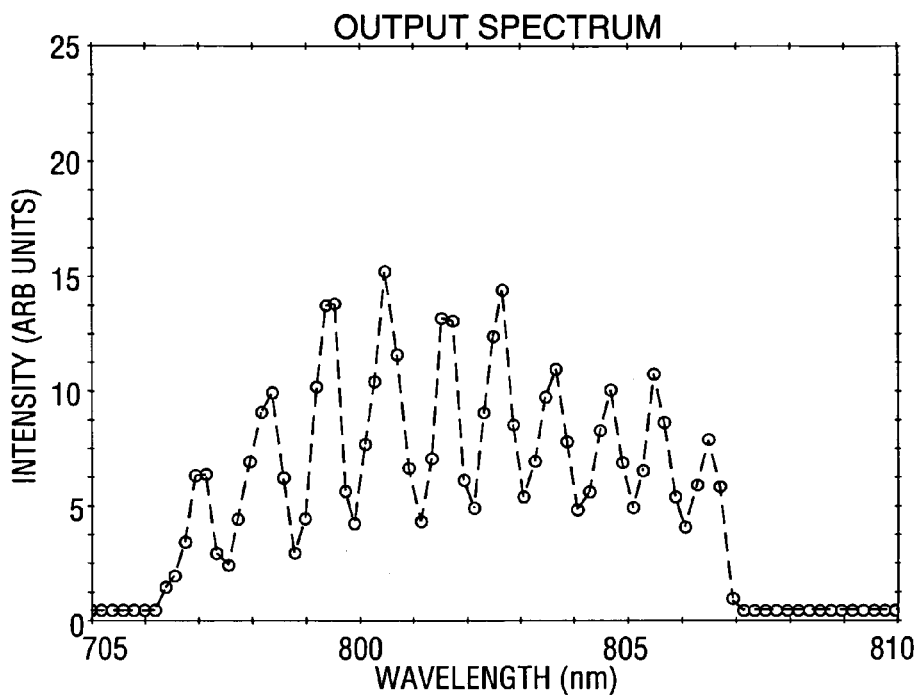
FIG. 3 shows a characteristic output wavelength spectrum from an SBC cavity with a broad-stripe diode laser source.

FIG. 3 shows a characteristic output wavelength spectrum from an SBC cavity with a broad-stripe diode laser source like that used to produce the data of FIG. 2. As shown, each emitter is operating at a different wavelength. Compared to a standard diode laser bar, the output bandwidth of the SBC system is larger.

Under typical SBC conditions, the beam quality obtained from a multimode, broad area emitter will be much poorer than the beam quality obtained from other types of laser diodes. For example, an SBC device fabricated using a diode laser bar consisting of a total of 10 broad stripes, each 150 microns wide, exhibited a beam quality 24 times the diffraction limit. This beam quality was due to the various sub-elements of the broad-stripe emitter being coupled, so that there is no longer an absolute relation between position along the stripe and wavelength. In fact, due to coupling between the sub-elements, a single position along the stripe will typically emit multiple wavelengths, producing a broad output beam after interaction with the dispersive element.

U.S. Pat. No. 6,192,062 states that the use of a properly selected spatial filter in an SBC system allows a laser comprised of a plurality of multi-traverse-mode gain elements to achieve an output beam that approaches the diffraction limit. Additionally it is noted that this beam quality can be achieved without inducing excessive losses. The inventors of the present invention have discovered that although the application of SBC techniques can dramatically improve the beam quality of such a laser, this improvement is accompanied by a reduction in output power. Whether or not the reduction is "excessive" clearly depends upon the desired application.

Figure 4:
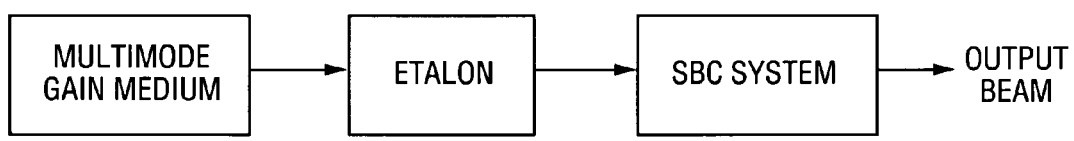
FIG. 4 schematically illustrates the invention.

The present invention allows SBC techniques to be applied to broad-stripe lasers or other multi-mode gain media (e.g., multi-mode fiber amplifiers) to improve beam quality with little, if any, reduction in output power. As illustrated in FIG. 4, a system in accordance with the invention passes the output from the multi-mode gain medium 401 through an etalon 403, the etalon preferably being within the SBC system 405. The purpose of etalon 403 is to cause spatial discretization of the emission from gain medium 401. Etalon 403, in combination with the dispersion of different wavelengths across the gain medium inherent in SBC devices, produces a row of discrete lasing regions, referred to herein as "pseudo emitters", across the gain element. The phrase pseudo emitters is used herein as they resemble the discrete emitters in conventional SBC devices using diode gain elements that are defined by the design of the laser diode chip. Each of these pseudo emitters corresponds to a different thin etalon transmission mode.

The spectral separation of etalon transmission modes is given by $$\Delta v = \frac{c}{2nt}, \text{ or } \Delta\lambda = \frac{\lambda^2}{2nt},$$

where n is the index of refraction of the etalon and t is its thickness. In accordance with the invention, many different types of etalon can be used to generate the required wavelength-periodic variations in transmission or reflectivity. Examples of suitable etalons include solid etalons, air-spaced etalons, and etalons comprised of one or more surfaces within the SBC cavity with non-negligible reflectivity. Preferably the etalon is located in the cavity such that the input beam to the etalon is sufficiently well collimated to avoid degrading the spectral resolution of the etalon. The required collimation can be estimated by considering the phase shift $\delta\psi$ across the face of the etalon, induced by imperfect collimation. If $\theta$ is the deviation from normal of the light incident on the face of the etalon and $\delta\theta$ is the angular width, then the phase shift $\Delta\psi$ can be written $$\frac{\Delta v}{2\pi v}\delta\psi = \frac{1}{2}(\delta\theta)^2 + \theta\delta\theta,$$

where $v$ is the frequency of the light, and $\Delta v$ is the spectral separation of the etalon modes as described above. To avoid significant loss of resolution, $\delta\psi$ should be less than 1. Then the limits on the incident angle and angular spread are given by $$\frac{1}{2}(\delta\theta)^2 + \theta\delta\theta < \frac{\Delta v}{2\pi v}.$$

It will be appreciated that although the preferred embodiment of the invention uses an etalon to generate wavelength-periodic variations in transmission or reflectivity, other means can also be used with the invention. For example, birefringent materials (e.g., high-order wave plates such as those made of quartz or calcite) can be combined with an SBC cavity with polarization-dependent gain or loss to produce similar results.

In the preferred embodiment of the invention, the broad-stripe laser diode is modified to serve as the etalon. The mode spacing for laser diodes, assuming cavity lengths in the range of 0.5–2 millimeters and an index of refraction of approximately 3, is in the range 2.5–10 GHz. This mode spacing corresponds to a spatial separation of approximately 50–200 microns for a wavelength of approximately 0.8 microns.

The dispersion of an SBC cavity using a grating as the dispersive element is given by $$\frac{\partial \lambda}{\partial x} = \frac{d \cos\theta}{f},$$

where x represents the transverse coordinate along the face of the diode laser, d is the line spacing of the grating, f is the focal length of the collimating optic, and θ is the angle of incidence on the grating. Similar equations can be derived for SBC laser cavities using prisms or other dispersive elements. Those skilled in the art will recognize that the technique of generating pseudo emitters across the face of the gain medium is independent of the nature of the dispersive element, and also independent of the material constituting the gain medium.

To achieve high beam quality, the pseudo emitters must provide sufficient spatial separation to allow the spatial filter (e.g., an aperture, slit, etc.) to discriminate between adjacent emitting regions. From a combination of the above equations, the linear distance between the adjacent etalon modes across the face of the laser diode will be $$\Delta x = \frac{\lambda^2}{2nt}\frac{f}{d \cos\theta}.$$

To achieve the highest efficiency, Δx should not be substantially greater than the width of the lowest-order transverse mode of the cavity. Otherwise there will be unextracted gain regions left between the pseudo emitters. If Δx is substantially less than the width of the lowest-order transverse mode, the beam quality of the system output will suffer. Accordingly, the lateral spacing of the pseudo emitters should be at least one half the diameter of the fundamental mode of the cavity, preferably at least about the diameter of the fundamental mode of the cavity, and more preferably at least one half of the diameter of the fundamental mode of the cavity multiplied by a factor by which the output beam divergence exceeds the diffraction limit.

The inventors have also found that it is desirable to make the width of the spatial filter's aperture (e.g., slit, circular aperture, oblong aperture, etc.) such that its image, projected back to the laser diode, is only large enough to admit emission from a single pseudo emitter. As such, preferably the image of the aperture projected back onto the front facet of the laser diode is less than twice the lateral spacing between adjacent pseudo emitters, and more preferably the image of the aperture projected back onto the front facet of the laser diode is less than twice the lateral spacing between adjacent pseudo emitters multiplied by the factor by which the output beam divergence exceeds the diffraction limit.

Figure 5:
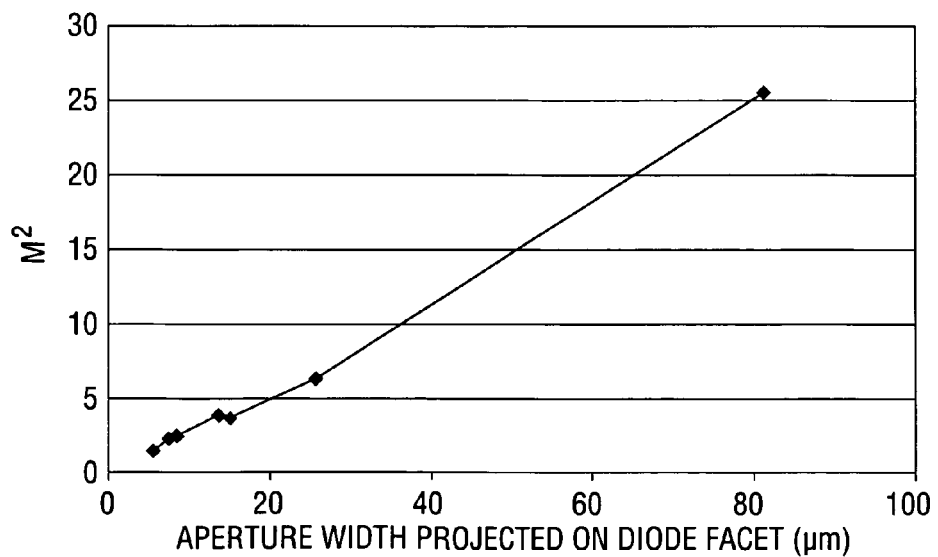
FIG. 5 graphically illustrates the relationship between SBC spatial filter aperture width and beam quality.

FIG. 5 illustrates the importance of selecting the correct aperture size. In this particular case, the fundamental laser cavity mode at the diode laser face is about 5 microns in diameter and the aperture is a slit. The parameter $M^2$ indicates the degradation of beam quality as more and more modes are admitted through the aperture. The $M^2$ parameter is roughly the number of times the slit width (as imaged by the optical system back to the diode face) exceeds the mode size.

In a typical SBC device using discrete emitters, the goal is to reduce the reflectivity of the front facet of the laser diode to a value as low as possible. In contrast, in the preferred embodiment of the invention in which the laser diode is comprised of broad-stripe gain elements and is used both as the gain medium and as the etalon, the reflectivity of the front face of laser diode is selected to be within certain boundaries.

The preferred front facet reflectivity can be determined by modeling the laser diode as a reflective etalon that contains a gain medium. If the front face and back face of the laser diode (etalon) have power reflectivities $R_1$ and $R_2$, respectively, then we can define $$\rho_1 = \sqrt{R_1},\ \rho_2 = \sqrt{R_2}\ \text{and}\ T_1 = \sqrt{1-\rho_1^2},$$

where the ρ values correspond to reflection factors for the electric field amplitudes and $T_1$ is the transmission of the front face of the etalon. The phase shift for one round-trip through the etalon can be given by $$\delta(x) = 2\pi n \frac{2t}{\lambda(x)},$$

where n is the index of refraction of the gain medium, t is the length of the diode gain cavity (spacing between front and back facets) and λ(x) is the wavelength selected by the external SBC cavity, at the lateral position x across the face of the laser diode gain element.

Based upon the above, several useful factors can be defined:

$$A(x) = T_1^2 \rho_1 \rho_2^2 e^{2i\delta(x)},\ B(x) = T_1^2 \rho_2 e^{i\delta(x)},\ \text{and}\ D(x) = 1 - (\rho_1 \rho_2)^2 e^{2i\delta(x)}.$$

The reflectivity of the etalon is then $$R(x) = \left| -\rho_1 + \frac{A(x) - B(x)}{D(x)} \right|^2$$

These formulas have been derived generally, such that the gain of the etalon can be modeled by choosing values of the diode back surface reflectivity $R_1$ greater than unity.

In FIGS. 6–11, the gain of the etalon described above is plotted against wavelength, assuming a back facet reflectivity of 5 and a front facet reflectivity ranging from 0.03 to 0.0055. The x-axis in FIGS. 6–11 is in microns and is appropriate to the grating equation for a typical SBC set up. These figures graphically illustrate that as the front facet reflectivity is reduced, the modulation in etalon gain versus wavelength is also reduced. The peaks mark the positions where it is desirable to create pseudo emitters while the valleys mark areas in which lasing is not desired. These figures also illustrate that the width of a pseudo emitter is not set only by the etalon reflective gain. Instead, the spatial filter width and magnification in the SBC cavity are the principal factors. As a result, it is possible to have a pseudo emitter width that is many etalon periods wide and can include many etalon gain peaks.

Figure 6:
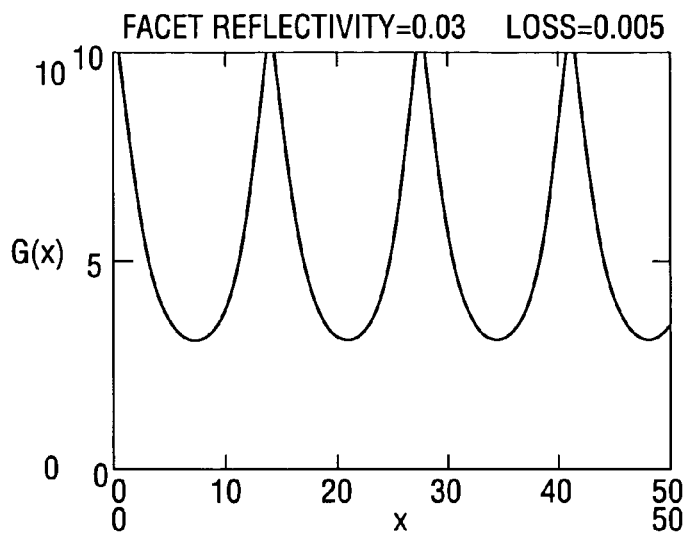
FIG. 6 graphically illustrates the relationship between wavelength and gain for an etalon in which the reflectivity of the back face is 5 and the reflectivity of the front face is 0.03.
Figure 7:
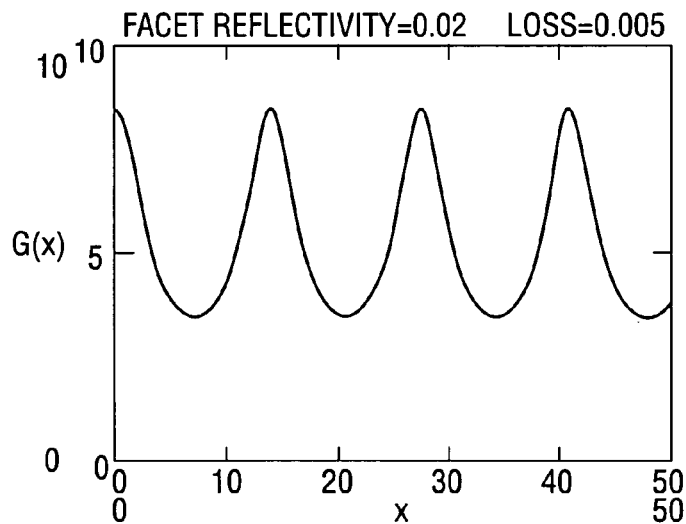
FIG. 7 graphically illustrates the relationship between wavelength and gain for an etalon in which the reflectivity of the back face is 5 and the reflectivity of the front face is 0.02.
Figure 8:
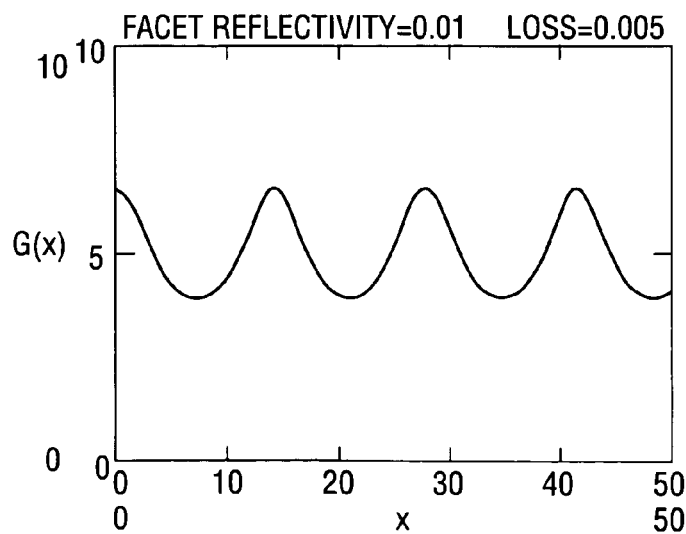
FIG. 8 graphically illustrates the relationship between wavelength and gain for an etalon in which the reflectivity of the back face is 5 and the reflectivity of the front face is 0.01.
Figure 9:
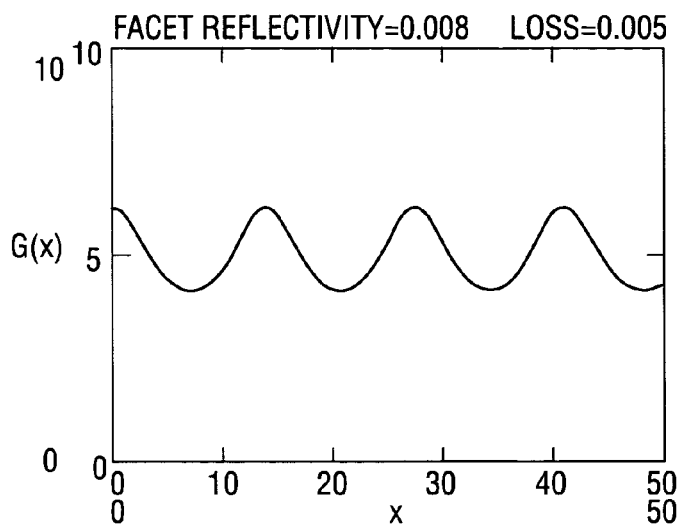
FIG. 9 graphically illustrates the relationship between wavelength and gain for an etalon in which the reflectivity of the back face is 5 and the reflectivity of the front face is 0.008.
Figure 10:
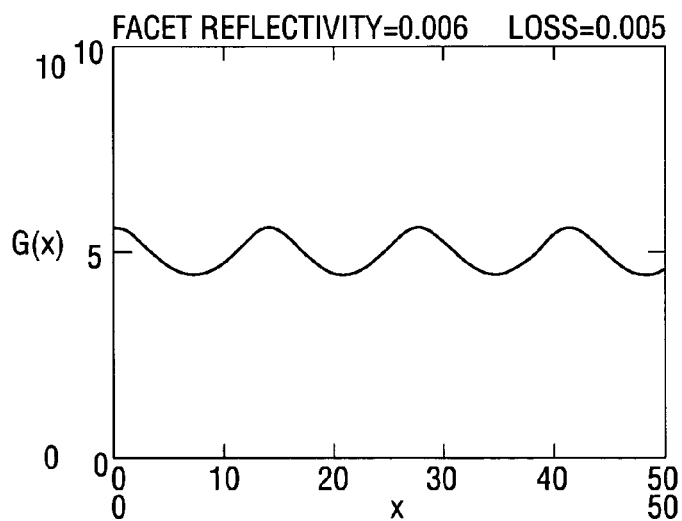
FIG. 10 graphically illustrates the relationship between wavelength and gain for an etalon in which the reflectivity of the back face is 5 and the reflectivity of the front face is 0.006.
Figure 11:
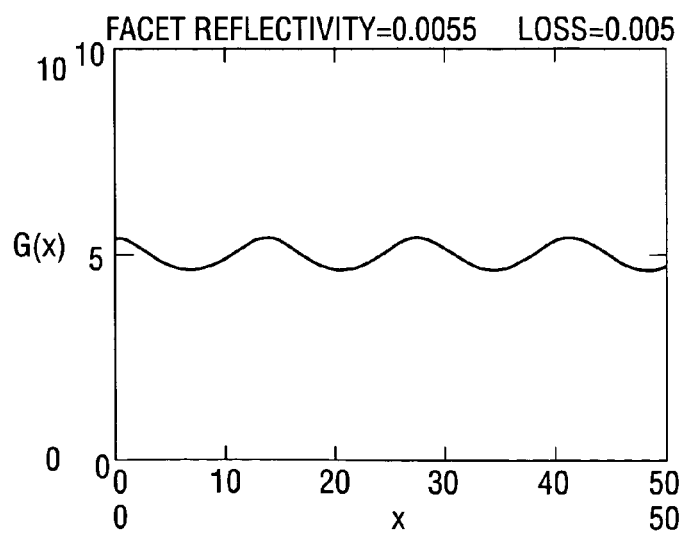
FIG. 11 graphically illustrates the relationship between wavelength and gain for an etalon in which the reflectivity of the back face is 5 and the reflectivity of the front face is 0.0055.

FIG. 6 depicts a system where the gain is 5, the front facet reflectivity is 3% and a small amount of loss is added. If the SBC output coupling reflectivity is 20%, then the semiconductor etalon is above threshold when G(x) is above 5. In this case there will be clear discrimination between the pseudo emitters. As the front facet reflectivity is reduced (FIGS. 7–11) the pseudo emitters drop closer to the threshold and the areas in between are moving towards threshold.

As the front facet reflectivity drops, discrimination between the pseudo emitters will be lost and the space between them will be lost.

The lower bound on the facet reflectivity may depend on many factors, but the primary factor is the ability to extract power efficiently from the pseudo emitters. To extract efficiently, the etalon gain peaks must be able to be loaded by a factor of at least 1.5, and preferably loaded by a factor in the range of 2–4. When this loading occurs, the peak gain is reduced and must remain above the gain between the emitters. This condition can be quantified by requiring the maximum etalon gain peaks to be at least a factor of 1.5, and preferably a factor of 2–4, higher than the minimum etalon gain. The minimum etalon gain occurs when $\delta(x)$ is equal to $\pi, 3\pi, \ldots$ radians and a maximum etalon gain occurs when $\delta(x)$ is equal to $0, 2\pi, 4\pi, \ldots$ radians. Using this condition, the ratio of maximum to minimum gain can be computed. The resulting ratio is presented in FIG. 12 where a plot of minimum front facet reflectivity versus small signal gain is shown for ratios of maximum to minimum etalon gains of 2 and 4.

The upper bound for the front facet reflectivity is chosen to prevent the laser gain element from exceeding the lasing threshold without feedback from the external cavity. Accordingly lasing is suppressed at the wavelengths of minimum gain. This can be quantified as:

$$R_1 < \frac{1}{R_2},$$

where $R_2$ contains the gain of the laser gain element.

Figure 12:
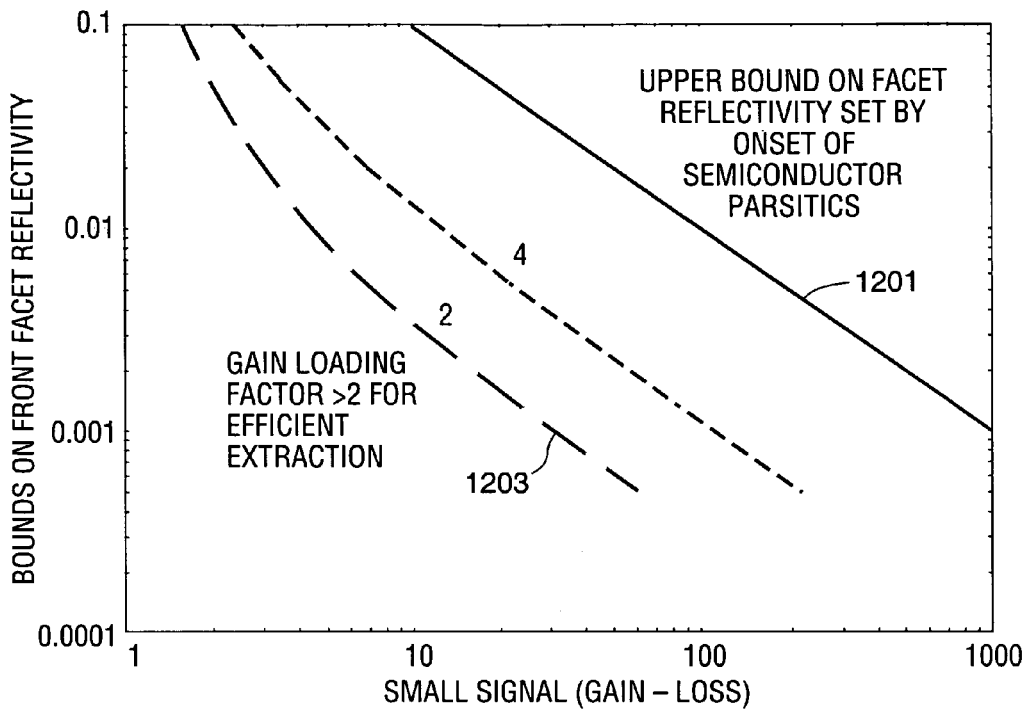
FIG. 12 graphically illustrates the relationship between minimum front facet reflectivity and small signal gain for ratios of maximum to minimum etalon gains of 2 and 4.
Figure 13:
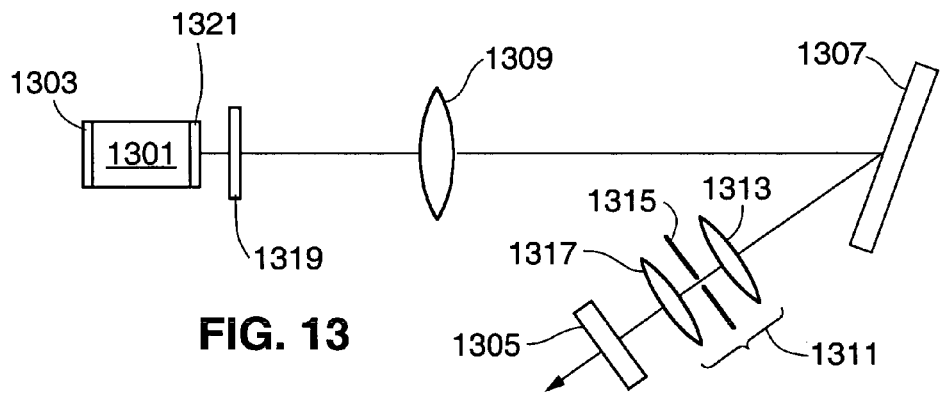
FIG. 13 illustrates a first embodiment of the invention utilizing an etalon integrated into the gain medium.
Figure 14:
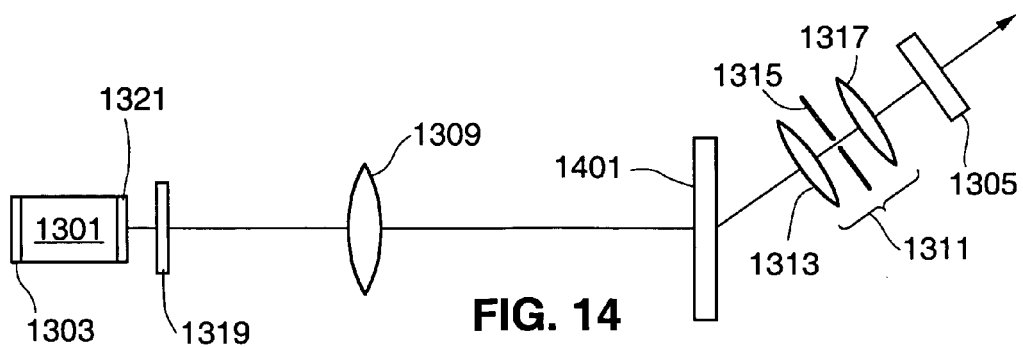
FIG. 14 illustrates a second embodiment of the invention utilizing an etalon integrated into the gain medium.
Figure 15:
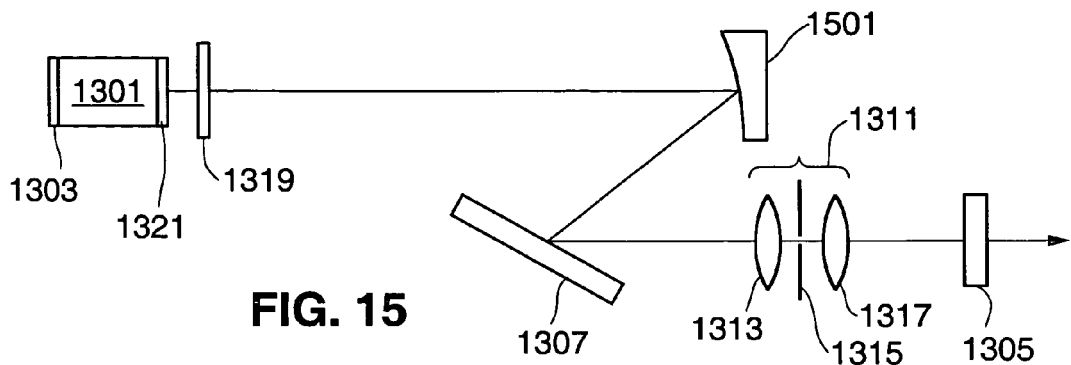
FIG. 15 illustrates a third embodiment of the invention utilizing an etalon integrated into the gain medium.
Figure 16:
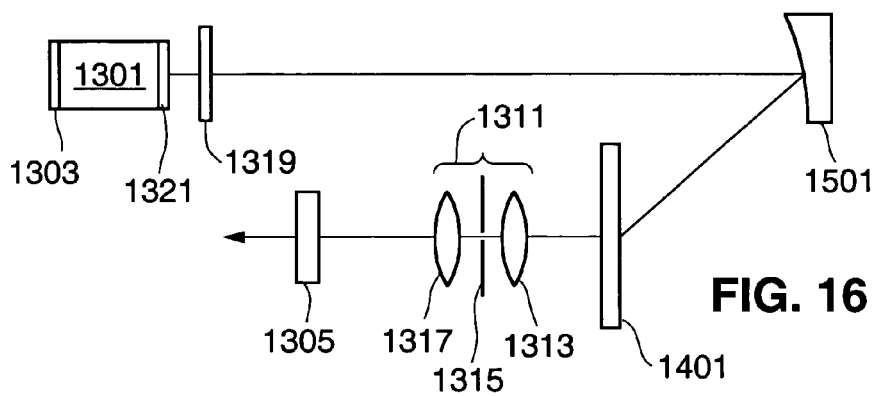
FIG. 16 illustrates a fourth embodiment of the invention utilizing an etalon integrated into the gain medium.
Figure 17:
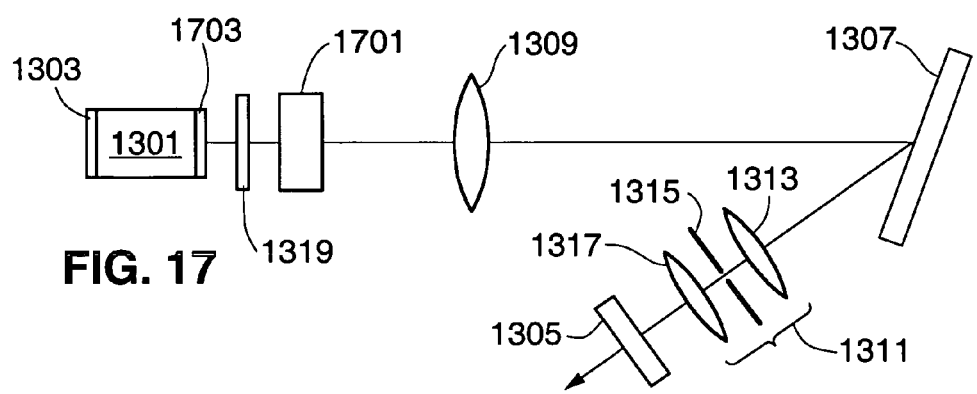
FIG. 17 illustrates a first embodiment of the invention utilizing an etalon separate from the gain medium.
Figure 18:
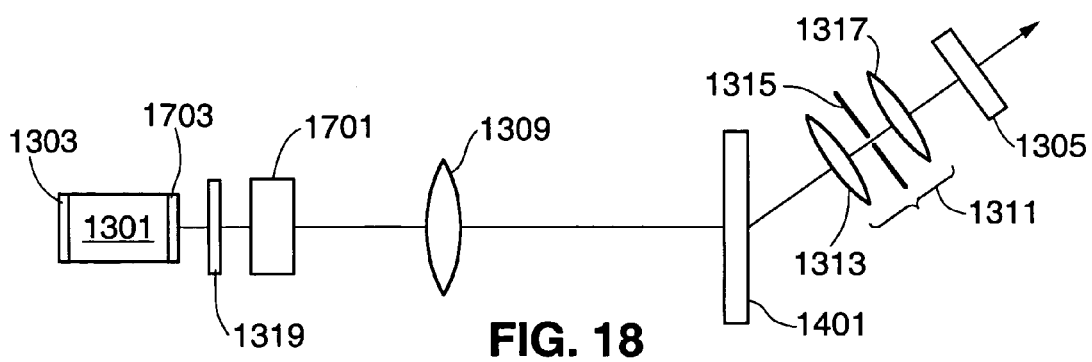
FIG. 18 illustrates a second embodiment of the invention utilizing an etalon separate from the gain medium.
Figure 19:
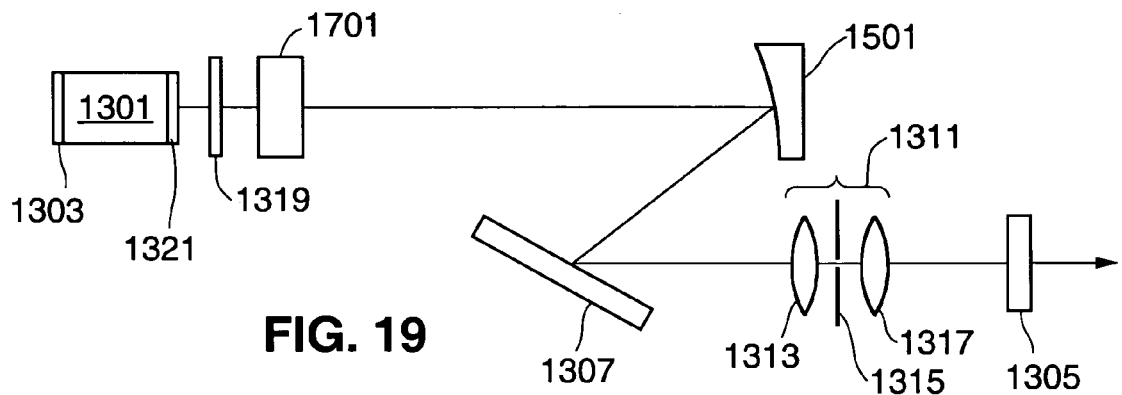
FIG. 19 illustrates a third embodiment of the invention utilizing an etalon separate from the gain medium.
Figure 20:
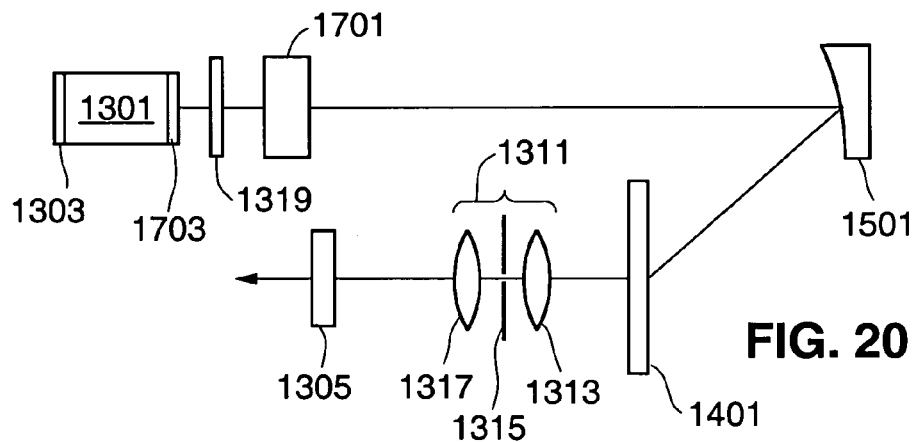
FIG. 20 illustrates a fourth embodiment of the invention utilizing an etalon separate from the gain medium.

The upper limit on front facet reflectivity is also included in FIG. 12. In the region between the upper bound 1201 and line 1203 denoting a gain loading of 2, there will be efficient extraction from the pseudo emitters and suppression of lasing between pseudo emitters.

As will be appreciated by those of skill in the art, as long as the system's etalon is designed in accordance with the guidelines disclosed above, there are countless possible variations of the present invention utilizing both reflective and transmissive optics. FIGS. 13–16 illustrate four possible embodiments, each employing a broad-stripe laser diode 1301 as the source. The external resonator cavity is comprised of a high reflectance coating 1303, preferably applied to the back facets of laser device 1301, and an output coupler 1305. The wavelength dispersive element within the SBC cavity can either be reflective, such as a reflective diffraction grating 1307 illustrated in FIGS. 13 and 15, or transmissive, such as a transmissive diffraction grating or prism 1401 illustrated in FIGS. 14 and 16. Interposed between laser diode 1301 and the dispersive element are collimating optics, either transmissive optics 1309 or reflective optics 1501. Interposed between the dispersive element and output coupler 1305 is a spatial filter 1311. The spatial filter can be comprised of an aperture (e.g., slit, circular aperture, oblong aperture, etc.) or an aperture and optics. In the illustrated embodiments, spatial filter 1311 is comprised of a first lens 1313, a slit 1315 and a second lens 1317. Although spatial filter 1311 is shown comprised of transmissive elements, it will be appreciated that reflective elements can also be used. Additionally, although spatial filter 1311 is shown comprised of a slit, other aperture types could be used. As previously noted, preferably the width of the spatial filter's aperture (i.e., slit 1315) is selected to be wide enough so that its image, projected back onto the front facet of laser diode 1301, is only large enough to admit emissions from a single pseudo emitter.

Although not required, the illustrated embodiments of the invention include an additional optical element 1319 positioned adjacent to the emitting facets of laser diode 1301. Due to the rapidly diverging, astigmatic nature of the emissions from laser diode 1301, optical element 1319 is useful for reducing the divergence, thus allowing a reduction in the size of the optics that follow optic 1319. Optical element 1319 can be comprised of a single lens or a plurality of lens elements. For example, optic 1319 can be comprised of a fast cylindrical lens that reduces the divergence of the laser diode's emissions in the fast axis while having negligible impact on the divergence of the emissions in the slow axis.

As previously noted, in the SBC systems shown in FIGS. 13–16 laser diode 1301 acts as the system's etalon. More specifically, the etalon includes rear facet high reflectance coating 1303 and front facet reflective coating 1321. The reflectivity of front facet coating 1321 is selected such that it falls between a minimum reflectivity required to achieve a gain loading of 2, and a maximum reflectivity required to prevent laser diode 1301 from exceeding the lasing threshold without feedback from the external cavity.

FIGS. 17–20 illustrate a second set of embodiments similar to those shown in FIGS. 13–16 except that the means used to generate the wavelength-periodic variations, and thus the pseudo emitters, is separate from laser diode 1301. As shown, the second set of embodiments includes an etalon 1701 although it will be appreciated that other means (e.g., birefringent materials) can also be used. Due to the inclusion of a separate etalon, coating 1703 applied to the front facet of laser diode 1301 is preferably an AR coating selected to minimize reflections from the laser diode's front face. As previously noted, preferably etalon 1701 is located within the SBC cavity such that the input to the etalon is substantially collimated. As etalon design is well understood, further discussions of the particulars associated with etalon 1701 will not be provided herein.

As will be understood by those familiar with the art, the present invention may be embodied in other specific forms without departing from the spirit or essential characteristics thereof. Accordingly, the disclosures and descriptions herein are intended to be illustrative, but not limiting, of the scope of the invention which is set forth in the following claims.

What is claimed is:

1. A spectral beam combining (SBC) optical system comprising:
    a broad-stripe laser diode;
    an external resonator cavity comprising:
        a mirror located adjacent to a first facet of said broad-stripe laser diode; and
        an output coupler, wherein emissions from a second facet of said broad-stripe laser diode are incident on said output coupler, said output coupler outputting a single output beam;
    a dispersive element interposed between said broad-stripe laser diode and said output coupler, said dispersive element reflecting a portion of said emissions back into said broad-stripe laser diode;
    a collimating optical system interposed between said broad-stripe laser diode and said dispersive element, said collimating optical system spatially overlapping emissions from said broad-stripe laser diode onto said dispersive element;

a spatial filter interposed between said dispersive element and said output coupler, wherein said spatial filter comprises an aperture; and means for creating a plurality of pseudo emitters across said second facet of said broad-stripe laser diode with a corresponding lateral spacing between adjacent pseudo emitters, said means located within said external cavity, wherein said means generates wavelength-periodic variations in transmission or reflectivity, and wherein an aperture width associated with said aperture forms an image at said second facet of said broad-stripe laser diode less than twice said lateral spacing of adjacent pseudo emitters multiplied by a factor by which the output beam divergence exceeds the diffraction limit.

2. The SBC optical system of claim 1, wherein said mirror further comprises a reflective coating applied to said first facet of said broad-stripe laser diode.

3. The SBC optical system of claim 1, wherein said collimating optical system is located a distance from said second facet of said broad-stripe laser diode substantially equivalent to a collimating optical system focal length.

4. The SBC optical system of claim 1, wherein said collimating optical system is located a distance from said dispersive element substantially equivalent to a collimating optical system focal length.

5. The SBC optical system of claim 1, further comprising a divergence reducing optical system adjacent to second facet of said broad-stripe laser diode, said divergence reducing optical system reducing divergence in the emissions corresponding to a fast axis of said broad-stripe laser diode.

6. The SBC optical system of claim 1, wherein said pseudo emitter creating means is comprised of a birefringent material.

7. The SBC optical system of claim 1, wherein said pseudo emitter creating means is comprised of an etalon.

8. The SBC optical system of claim 7, wherein said etalon is located between said broad-stripe laser diode and said dispersive element.

9. The SBC optical system of claim 2, wherein said pseudo emitter creating means is comprised of an etalon, said etalon comprising said broad-stripe laser diode, said reflective coating applied to said first facet of said broad-stripe laser diode and a second reflective coating applied to said second facet of said broad-stripe laser diode.

10. The SBC optical system of claim 9, wherein a maximum gain corresponding to said plurality of pseudo emitters is at least 1.5 times higher than a minimum gain corresponding to said plurality of pseudo emitters.

11. The SBC optical system of claim 10, wherein said maximum gain is between 2 and 4 times higher than said minimum gain.

12. The SBC optical system of claim 1, wherein a maximum gain corresponding to said plurality of pseudo emitters is at least 1.5 times higher than a minimum gain corresponding to said plurality of pseudo emitters.

13. The SBC optical system of claim 12, wherein said maximum gain is between 2 and 4 times higher than said minimum gain.

14. The SBC optical system of claim 9, wherein lasing is suppressed at a plurality of minimum gain locations associated with said plurality of pseudo emitters.

15. The SBC optical system of claim 14, wherein said plurality of minimum gain locations correspond to a plurality of wavelengths.

16. The SBC optical system of claim 1, wherein lasing is suppressed at a plurality of minimum gain locations associated with said plurality of pseudo emitters.

17. The SBC optical system of claim 16, wherein said plurality of minimum gain locations correspond to a plurality of wavelengths.

18. The SBC optical system of claim 1, wherein said lateral spacing is at least equivalent to one half of a fundamental mode diameter associated with said external resonator cavity.

19. The SBC optical system of claim 1, wherein said lateral spacing is at least equivalent to a fundamental mode diameter associated with said external resonator cavity.

20. A spectral beam combining (SBC) optical system comprising:
   a broad-stripe laser diode;
   an external resonator cavity comprising:
      a mirror located adjacent to a first facet of said broad-stripe laser diode; and
      an output coupler, wherein emissions from a second facet of said broad-stripe laser diode are incident on said output coupler, said output coupler outputting a single output beam;
   a dispersive element interposed between said broad-stripe laser diode and said output coupler, said dispersive element reflecting a portion of said emissions back into said broad-stripe laser diode;
   a collimating optical system interposed between said broad-stripe laser diode and said dispersive element, said collimating optical system spatially overlapping emissions from said broad-stripe laser diode onto said dispersive element;
   a spatial filter interposed between said dispersive element and said output coupler; and
   means for creating a plurality of pseudo emitters across said second facet of said broad-stripe laser diode with a corresponding lateral spacing between adjacent pseudo emitters, said means located within said external cavity, wherein said means generates wavelength-periodic variations in transmission or reflectivity, and wherein said lateral spacing is equivalent to at least one half of a fundamental mode diameter associated with said external resonator cavity multiplied by a factor by which the output beam divergence exceeds the diffraction limit.

21. The SBC optical system of claim 20, wherein said mirror further comprises a reflective coating applied to said first facet of said broad-stripe laser diode.

22. The SBC optical system of claim 20, wherein said collimating optical system is located a distance from said second facet of said broad-stripe laser diode substantially equivalent to a collimating optical system focal length.

23. The SBC optical system of claim 20, wherein said collimating optical system is located a distance from said dispersive element substantially equivalent to a collimating optical system focal length.

24. The SBC optical system of claim 20, wherein said spatial filter comprises an aperture.

25. The SBC optical system of claim 24, wherein said aperture is selected from the group consisting of slits, circular apertures and oblong apertures.

26. The SBC optical system of claim 24, wherein an aperture width associated with said aperture forms an image at said second facet of said broad-stripe laser diode less than twice said lateral spacing of adjacent pseudo emitters.

27. The SBC optical system of claim 24, wherein said aperture comprises a slit, and wherein a slit width associated with said slit forms an image at said second facet of said broad-stripe laser diode less than twice said lateral spacing of adjacent pseudo emitters.

28. The SBC optical system of claim 20, further comprising a divergence reducing optical system adjacent to second facet of said broad-stripe laser diode, said divergence reducing optical system reducing divergence in the emissions corresponding to a fast axis of said broad-stripe laser diode.

29. The SBC optical system of claim 20, wherein said pseudo emitter creating means is comprised of a birefringent material.

30. The SBC optical system of claim 20, wherein said pseudo emitter creating means is comprised of an etalon.

31. The SBC optical system of claim 30, wherein said etalon is located between said broad-stripe laser diode and said dispersive element.

32. The SBC optical system of claim 21, wherein said pseudo emitter creating means is comprised of an etalon, said etalon comprising said broad-stripe laser diode, said reflective coating applied to said first facet of said broad-stripe laser diode and a second reflective coating applied to said second facet of said broad-stripe laser diode.

33. The SBC optical system of claim 32, wherein a maximum gain corresponding to said plurality of pseudo emitters is at least 1.5 times higher than a minimum gain corresponding to said plurality of pseudo emitters.

34. The SBC optical system of claim 33, wherein said maximum gain is between 2 and 4 times higher than said minimum gain.

35. The SBC optical system of claim 20, wherein a maximum gain corresponding to said plurality of pseudo emitters is at least 1.5 times higher than a minimum gain corresponding to said plurality of pseudo emitters.

36. The SBC optical system of claim 35, wherein said maximum gain is between 2 and 4 times higher than said minimum gain.

37. The SBC optical system of claim 32, wherein lasing is suppressed at a plurality of minimum gain locations associated with said plurality of pseudo emitters.

38. The SBC optical system of claim 37, wherein said plurality of minimum gain locations correspond to a plurality of wavelengths.

39. The SBC optical system of claim 20, wherein lasing is suppressed at a plurality of minimum gain locations associated with said plurality of pseudo emitters.

40. The SBC optical system of claim 39, wherein said plurality of minimum gain locations correspond to a plurality of wavelengths.

41. The SBC optical system of claim 20, wherein said lateral spacing is at least equivalent to a fundamental mode diameter associated with said external resonator cavity.

42. A method for improving the beam quality of a broad-stripe laser diode, the method comprising the steps of:
    forming a plurality of pseudo emitters from an output of the broad-stripe laser diode;
    laterally spacing said pseudo emitters by at least one half of a fundamental cavity mode diameter multiplied by a factor corresponding to an amount by which an output beam divergence exceeds a system diffraction limit; and
    passing a plurality of emissions corresponding to said plurality of pseudo emitters through an SBC optical system.

43. The method of claim 42, wherein said forming step comprises the step of transmitting the output of the broad-stripe laser diode through an etalon.

44. The method of claim 42, further comprising the step of suppressing lasing at a plurality of wavelengths corresponding to pseudo emitter minimums.

45. A method for improving the beam quality of a broad-stripe laser diode, the method comprising the steps of:
    forming a plurality of pseudo emitters from an output of the broad-stripe laser diode;
    passing a plurality of emissions corresponding to said plurality of pseudo emitters through an SBC optical system; and
    selecting a slit width for a slit associated with a spatial filter of said SBC optical system so that an image of said slit projected onto a front facet of the broad-strip laser diode is less than twice a lateral spacing of adjacent pseudo emitters multiplied by a factor corresponding to an amount by which an output beam divergence exceeds a system diffraction limit.

46. The method of claim 45, wherein said forming step further comprises the step of laterally spacing said pseudo emitters by at least one half of a fundamental cavity mode diameter.

47. The method of claim 45, wherein said forming step further comprises the step of laterally spacing said pseudo emitters by at least a fundamental cavity mode diameter.

48. The method of claim 45, wherein said forming step comprises the step of transmitting the output of the broad-stripe laser diode through an etalon.

49. The method of claim 45, further comprising the step of suppressing lasing at a plurality of wavelengths corresponding to pseudo emitter minimums.

50. The SBC optical system of claim 1, wherein said aperture is selected from the group consisting of slits, circular apertures and oblong apertures.

* * * * *